United States Patent [19]

Fujiwara

[11] Patent Number: 5,695,597
[45] Date of Patent: Dec. 9, 1997

[54] PLASMA REACTION APPARATUS

[75] Inventor: Nobuo Fujiwara, Hyogo, Japan

[73] Assignee: Mitsubishi Denki Kabushiki Kaisha, Tokyo, Japan

[21] Appl. No.: 518,609

[22] Filed: Aug. 17, 1995

Related U.S. Application Data

[63] Continuation-in-part of Ser. No. 149,450, Nov. 9, 1993.

[30] Foreign Application Priority Data

Nov. 11, 1992 [JP] Japan .................. 4-300938

[51] Int. Cl.$^6$ .................................... H05H 11/00
[52] U.S. Cl. .......................... 156/345; 118/723 E
[58] Field of Search .................. 156/345; 204/298.37; 118/723 E, 723 ER; 216/71

[56] References Cited

U.S. PATENT DOCUMENTS

| | | | |
|---|---|---|---|
| 4,438,368 | 3/1984 | Abe et al. | 315/111.41 X |
| 4,891,095 | 1/1990 | Ishida et al. | 156/643 |
| 5,091,049 | 2/1992 | Campbell et al. | 156/643 |
| 5,221,427 | 6/1993 | Koinuma et al. | 156/643 |

FOREIGN PATENT DOCUMENTS

| | | |
|---|---|---|
| 65277 | 11/1982 | European Pat. Off. . |
| 432573 | 6/1991 | European Pat. Off. . |
| 4118973 | 12/1992 | Germany . |
| 59-27212 | 7/1984 | Japan . |
| 45024 | 3/1985 | Japan ............... 156/298.37 |
| 61-86942 | 5/1986 | Japan . |
| 61-128527 | 6/1986 | Japan . |
| 243286 | 10/1988 | Japan ............... 156/345 |
| 241034 | 9/1990 | Japan ............... 156/345 |
| WO 92/22920 | 6/1992 | WIPO . |
| WO 92/22920 | 12/1992 | WIPO . |

OTHER PUBLICATIONS

Kostadinov et al., "A low working pressure magnetron sputtering source", *Vacuum*, vol. 42, 1991, pp. 35–35.

"Improved Sputter Deposition With Cylindrical Magnetrons", *IBM Technical Disclosure Bulletin*, vol. 27, No. 11, Apr. 1985, pp. 6796–6797.

Thornton et al., "Cylindrical Magnetron Sputtering", *Thin Film Processes*, Academic Press, RCA Laboratories, 1978, pp. 75–99.

*Primary Examiner*—Thi Dang
*Attorney, Agent, or Firm*—Lowe, Price, LeBlanc & Becker

[57] ABSTRACT

Electric field E is generated radially between reaction container and bar-shaped electrode, magnetic field B is formed perpendicular to the electric field, and wafer is disposed perpendicular to magnetic field B. Therefore, the E×B drift of plasma generated by magnetron discharge is in the tangential direction of a circle centered at bar-shaped electrode and is parallel to the surface of wafer, whereby maldistribution of plasma in the radial direction is restricted and plasma is distributed uniformly above the main surface of the wafer.

4 Claims, 7 Drawing Sheets

DISTANCE (cm)

PLASMA REACTION APPARATUS

This application is a continuation of application Ser. No. 08/149,450 filed Nov. 9, 1993.

BACKGROUND OF THE INVENTION

1. Field of the Invention

The present invention relates to a plasma reaction apparatus, and more particularly to a structure of a plasma reaction apparatus allowing uniform plasma generation above a main surface of a wafer.

2. Description of the Background Art

Recently, in manufacturing a semiconductor device such as IC, treatment such as etching is conducted after forming a thin film on a semiconductor substrate (referred to as a wafer hereinafter). One example of such wafer treatment apparatus is a plasma reaction apparatus utilizing plasma generated by gas discharge as described in Japanese Patent Laying-Open No. 61-86942.

FIG. 9 is a cross sectional view schematically showing a conventional plasma reaction apparatus for use in RIE (Reactive Ion Etching) and the like.

Referring to FIG. 9, a cathode 3 serving as one planar electrode is fixed at a bottom surface of, for example, a hollow column-shaped reaction container 1 via an insulating material 2. An anode 4 serving as the other planar electrode is fixed on a ceiling surface of reaction container 1. Cathode 3 and anode 4 are provided opposite to each other within reaction container 1, and a wafer 5 is placed on cathode 3.

A plurality of gas outlets 6a and gas passages 6b are formed on the anode 4. The gas passage 6b is connected to a gas inlet 7 formed on the ceiling surface of reaction container 1, and accordingly gas is introduced into reaction container 1 through gas inlet 7, gas passage 6b and gas outlet 6a. Then, the gas is exhausted from an exhaust 8 formed at the bottom of reaction container 1.

Meanwhile, one end of a high frequency power supply 9 is connected to cathode 3 through an impedance matching apparatus 10. The other end of high frequency power supply 9 is connected to the ground, and whereby an HF electric field (vector E) is formed between cathode 3 and anode 4 by the high frequency power supply 9.

A set of mirror magnetic field generating coil pairs 11a, 11b are provided at positions opposite to each other outside reaction container 1. As to these mirror magnetic field generating coils 11a, 11b, a plurality of mirror magnetic field generating coils are provided every certain angle relative to a central axis of reaction container 1 in order to control rotation of a mirror magnetic field electrically. Consequently, mirror magnetic field generating coils 11a, 11b are switched and rendered conductive in turn, and thus the mirror magnetic field (vector B) is rotated in a certain direction at a certain period. Thus, maldistribution or uneven distribution of plasma, which is based on drift (referred to as "E×B drift" as hereinafter) derived from the Lorentz's power of the plasma generated because of an orthogonal crossing of the mirror magnetic field and the HF magnetic field, is prevented.

By employing the apparatus of the above-described structure, when a thin film is formed on wafer 5 or etching is conducted, after sufficiently exhausting unnecessary gas within reaction container 1 through exhaust 8, a reactive gas is introduced into the reaction container through gas inlet 7, gas passage 6b and gas outlet 6a. Then, a portion of the reactive gas is exhausted from exhaust 8, whereby an internal pressure of reaction container 1 is kept at a predetermined value.

Next, HF power of 93.6 MHz is fed to cathode 3 by high frequency power supply 9. Thus, a mirror magnetic field is generated because coils 11a, 11b are rendered conductive. In reaction container 1, magnetron discharge is initiated by HF electric field generated between cathode 3 and anode 4 and by the mirror magnetic field having magnetic force of lines orthogonally crossing the HF electric field, thereby generating high density gas plasma. Formation of the thin film or etching is conducted on the surface of wafer 5 by this reaction of high density gas plasma.

Reactive gas, pressure, and power supplied by high frequency power supply 9 employed herein are selected appropriately corresponding to the types of wafer processing.

The plasma reaction apparatus structured as above includes the following problems.

In case of the plasma reaction apparatus structured as above, maldistribution of plasma due to drift is prevented and plasma density is made uniform by rotating the mirror magnetic field using a plurality (2–3) sets of mirror magnetic field generating coils. The plasma density is made uniform over a long time period; however, referring to FIG. 10, the plasma distribution is not uniform at an arbitrary time point (see P in the figure), so that distributions of the potential of wafer 5 are as plotted in FIG. 11 when viewed as a cross section taken along line A'-A of FIG. 10.

In FIG. 11, abscissa indicates a distance from the center of wafer 5 and ordinate indicates an absolute value of potential V, where a dash-dotted line represents a potential of wafer 5, a solid line represents local potential of the surface of wafer 5, and X mark denotes a measurement point. As can be seen from FIG. 11, potential V is smaller than the potential of wafer 5 where the plasma density is high, while it is higher than the potential of wafer 5 where the plasma density is low. The reason thereof is described in the following, as the following relationship holds:

$$P = V \cdot I$$

P: power density (W/cm$^2$)
V: voltage (V)
I: current density (A/cm$^2$)

More particularly, since P is set constant, potential V decreases in reverse proportion to the increase of plasma density I, while voltage V increases in reverse proportion to the decrease of the plasma density.

Therefore, when a difference is generated between the potential of wafer 5 and the local potential of the surface of wafer 5 at an arbitrary time, an electric field is exerted on a semiconductor device which is formed on the surface of wafer 5, and consequently an insulating film, especially a thin insulating film is damaged.

SUMMARY OF THE INVENTION

An object of the present invention is to provide a plasma reaction apparatus which can maintain high density plasma by magnetron discharge.

Another object of the present invention is to provide a plasma reaction apparatus having an excellent plasma uniformity above a main surface of a wafer and giving less damage to a semiconductor device formed on the wafer.

In order to achieve the above objects, a plasma reaction apparatus according to one aspect of the present invention includes electric field generating apparatus including a cylindrical reaction container having a predetermined radius and serving as a first electrode, and a bar-shaped electrode serving as a second electrode for generating an electric field between the bar-shaped electrode and the reaction container and having a central axis thereof disposed on a central axis of the reaction container; magnetic field generating apparatus disposed outside the reaction container for generating a magnetic field in the direction parallel to the central axis of the reaction container within the reaction container; and wafer placing apparatus for placing a wafer perpendicular to the magnetic field.

In the plasma reaction apparatus, an electric field is generated radially between the reaction container and the bar-shaped electrode, a magnetic field is formed orthogonally to the electric field, and a wafer is disposed perpendicular to the magnetic field.

Accordingly, the direction of the E×B drift of the plasma generated by the magnetron discharge on an arbitrary point of the wafer is in the tangential direction of a circle centered at the bar-shaped electrode and is parallel to the wafer surface, whereby maldistribution of the plasma in the radial direction of the wafer is restricted, causing the plasma above the main surface of the wafer to be uniform.

In order to achieve the above objects, in the plasma reaction apparatus according to another aspect of the present invention, the electric field generating apparatus generates an AC electric field by applying AC voltage between the reaction container and the bar-shaped electrode, and the magnetic field generating apparatus generates AC magnetic field utilizing an AC power supply for setting phase difference between the AC electric field and the AC magnetic field to 0° or 180°.

In the plasma reaction apparatus, E×B drift can be always kept in a certain direction and energy of ions and electrons in the plasma can be enhanced since the phase difference between the AC electric field and the AC magnetic field is set to 0° or 180°.

In order to achieve the above objects, in a further aspect of the present invention, the plasma reaction apparatus includes an electric field generating apparatus including a pair of electrodes disposed a predetermined distance apart from each other at opposite positions along outer surface of a cylindrical reaction container, each having a predetermined radius of curvature smaller than 180°, for generating an electric field within the reaction container; a magnetic field generating apparatus disposed outside the reaction container for generating a magnetic field in the direction perpendicular to the direction in which the pair of electrodes oppose with each other and perpendicular to the central axis of the reaction container; and a wafer placing apparatus for placing a wafer horizontal to the electric field and the magnetic field.

In the plasma reaction apparatus, the electric field and the magnetic field are set parallel to the wafer surface and are orthogonal with each other.

Consequently, maldistribution of the plasma in the direction parallel to the wafer surface is restricted so that the plasma above the main surface of the wafer can be made uniform, because the direction of E×B drift of the plasma generated by the magnetron discharge is perpendicular to the wafer surface.

In order to achieve the above objects, in the plasma reaction apparatus according to a still further aspect of the present invention, the electric field generating apparatus generates an AC electric field by applying AC voltage between the pair of electrodes, and the magnetic field generating apparatus generates an AC magnetic field utilizing an AC power supply for setting the phase difference between the AC electric field and the AC magnetic field to 0° or 180°, thereby generating plasma having high concentration toward the wafer surface.

Since the phase difference between the AC electric field and the AC magnetic field is set to 0° or 180°, all the E×B drift directions are directed to the wafer surface, thereby enabling enhancement of the energy of ions and electrons in the plasma reaction apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the present invention will be described.

Figure 1:
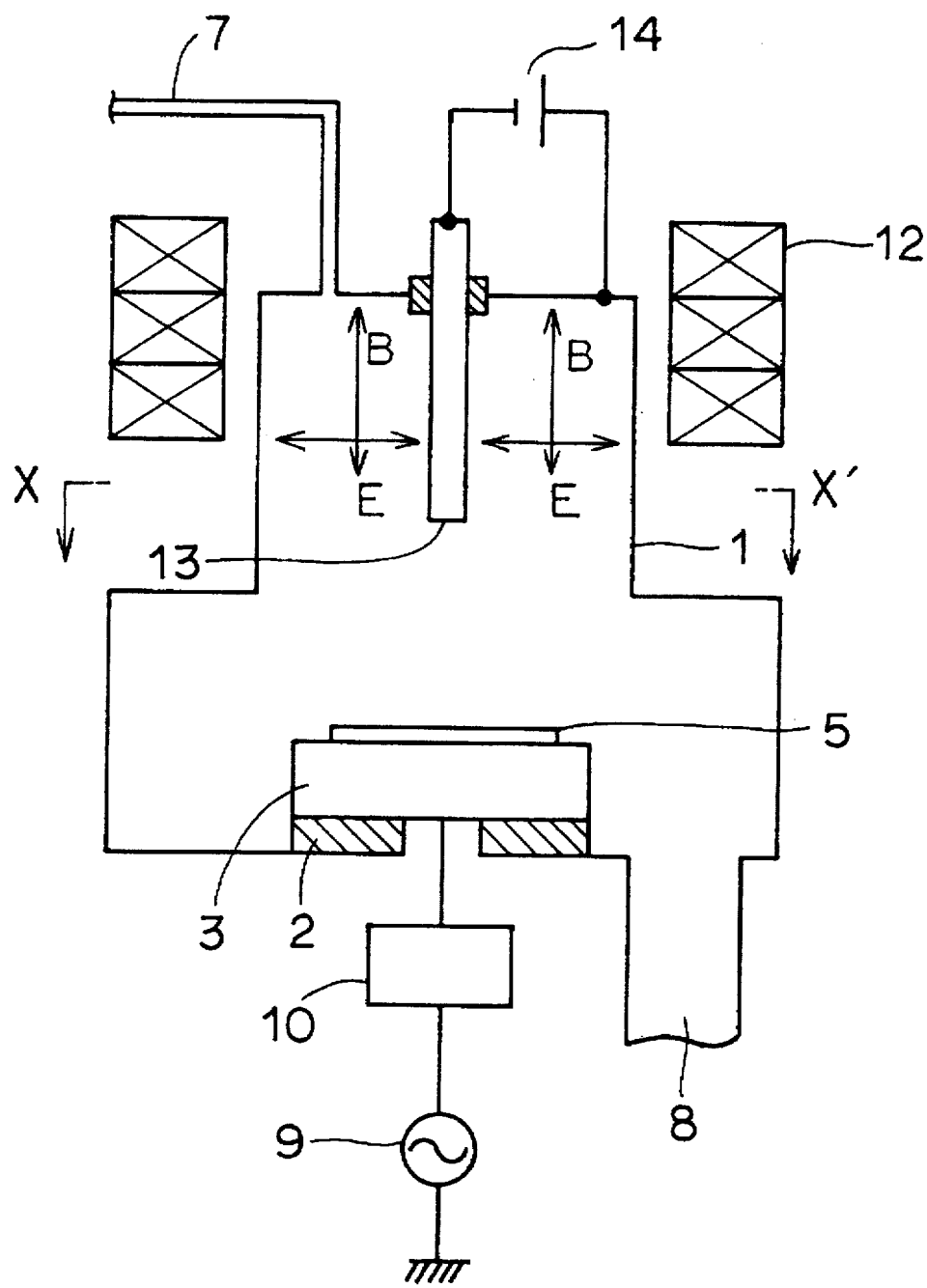
FIG. 1 is a sectional view of a plasma reaction apparatus according to a first embodiment of the present invention.

FIG. 1 is a sectional view of a plasma reaction apparatus according to the embodiment. Referring to the figure, the plasma reaction apparatus includes a cylindrical reaction container 1 having a predetermined radius and serving as a first electrode. A bar-shaped electrode 13 serving as a second electrode is provided on the central axis of reaction container 1 for generating an electric field (E) radially between bar-shaped electrode 13 and the reaction container having the central axis. A gas inlet 7 is provided on the upper side of reaction container 1 for introducing a reactive gas.

A solenoid coil 12 is provided outside reaction container 1 for generating a magnetic field (B) parallel to the extending direction of the reaction container within the first electrode.

A sample table 3 is provided on an insulating material 2 at the lower portion of reaction container 1, and a wafer 5 is placed on sample table 3. One end of a high frequency power supply 9 is connected to sample table 3 through an impedance matching apparatus 10, and the other end of high frequency power supply 9 is connected to the ground. An exhaust 8 is provided at the lower portion of reaction container 1.

When a thin film is formed on wafer 5 or etching is conducted in the plasma reaction apparatus having the above structure, unnecessary gas within reaction container 1 is exhausted sufficiently from exhaust 8. Then, reactive gas is introduced into reaction container 1 through gas inlet 7, and at the same time a portion thereof is exhausted from exhaust 8, so as to keep an internal pressure of reaction container 1 at a predetermined value. Then, a DC electric field (E) is generated between electrodes by connecting a DC power supply 14 between reaction container 1 and bar-shaped electrode 2. Also, a D.C. magnetic field (B) parallel to the direction of extension reaction container 1 is generated within reaction container 1 by solenoid coil 12.

Figure 2:
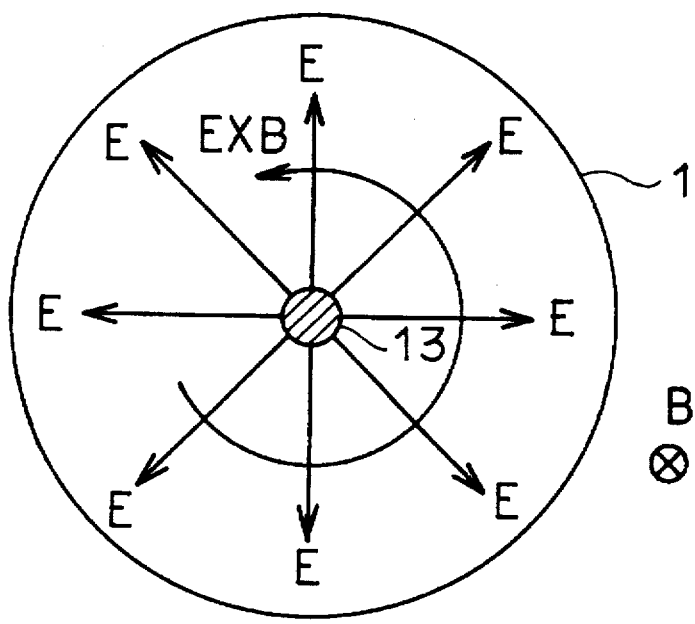
FIG. 2 is a cross sectional view taken along line X-X' in FIG. 1.

FIG. 2 is a cross sectional view taken along line X-X' in FIG. 1.

Referring to the figure, radial DC electric field E shown by arrows in the figure is generated between reaction container 1 and bar-shaped electrode 13 as voltage is applied from DC power supply 14 to bar-shaped electrode 13 disposed on the central axis of reaction container 1.

Meanwhile, DC magnetic field B is generated by solenoid coil 12 in the direction perpendicular to the cross section of FIG. 2.

Accordingly, the radial DC electric field E and DC magnetic field B of the axial direction are orthogonal with each other, so that the reactive gas introduced into reaction container 1 through gas inlet 7 is turned to plasma by the magnetron discharge.

Although high density plasma generated by the magnetron discharge drifts in the direction of E×B, the drift is in the tangential direction shown by an arrow E×B in FIG. 2 of a circle centered at the bar-shaped electrode, in other words, in the apparently circumferential direction. Therefore, the plasma generated between bar-shaped electrode 13 and reaction container 1 rotates uniformly in the apparently circumferential direction.

Accordingly, the plasma generated by the magnetron discharge does not cause maldistribution, so that density of plasma is uniform on wafer 5 at any time.

Figure 3:
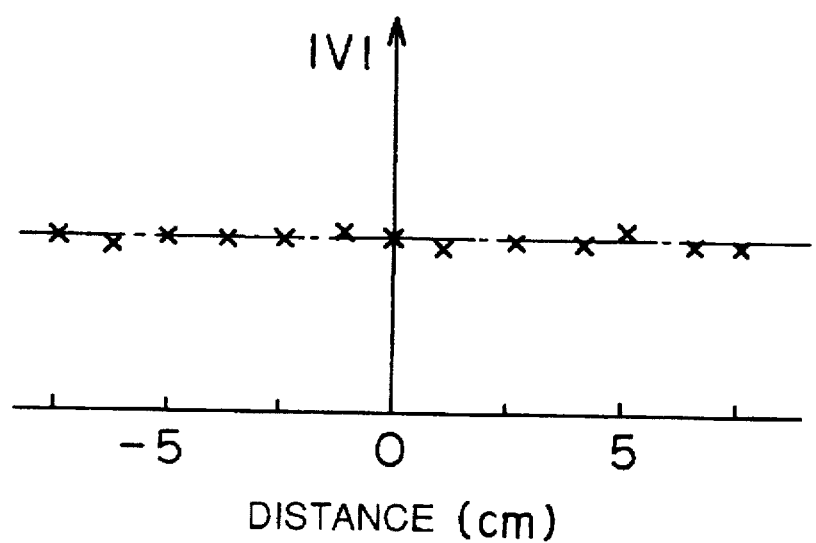
FIG. 3 shows potentials of a wafer and a wafer surface when the plasma reaction apparatus according to the first embodiment of the present invention is employed.

As shown in FIG. 3, the potential of the wafer and the potential of the wafer surface become uniform so as not to cause a difference between the wafer potential and the local potential of the wafer surface as it used to be, whereby damage of the device formed on the wafer can be prevented.

In FIG. 3, abscissa indicates distance from the center of wafer 5, ordinate indicates absolute value of potential B, a dash-dotted line represents a potential of the wafer, and x represents a potential of the wafer surface at a potential measurement point.

Figure 4:
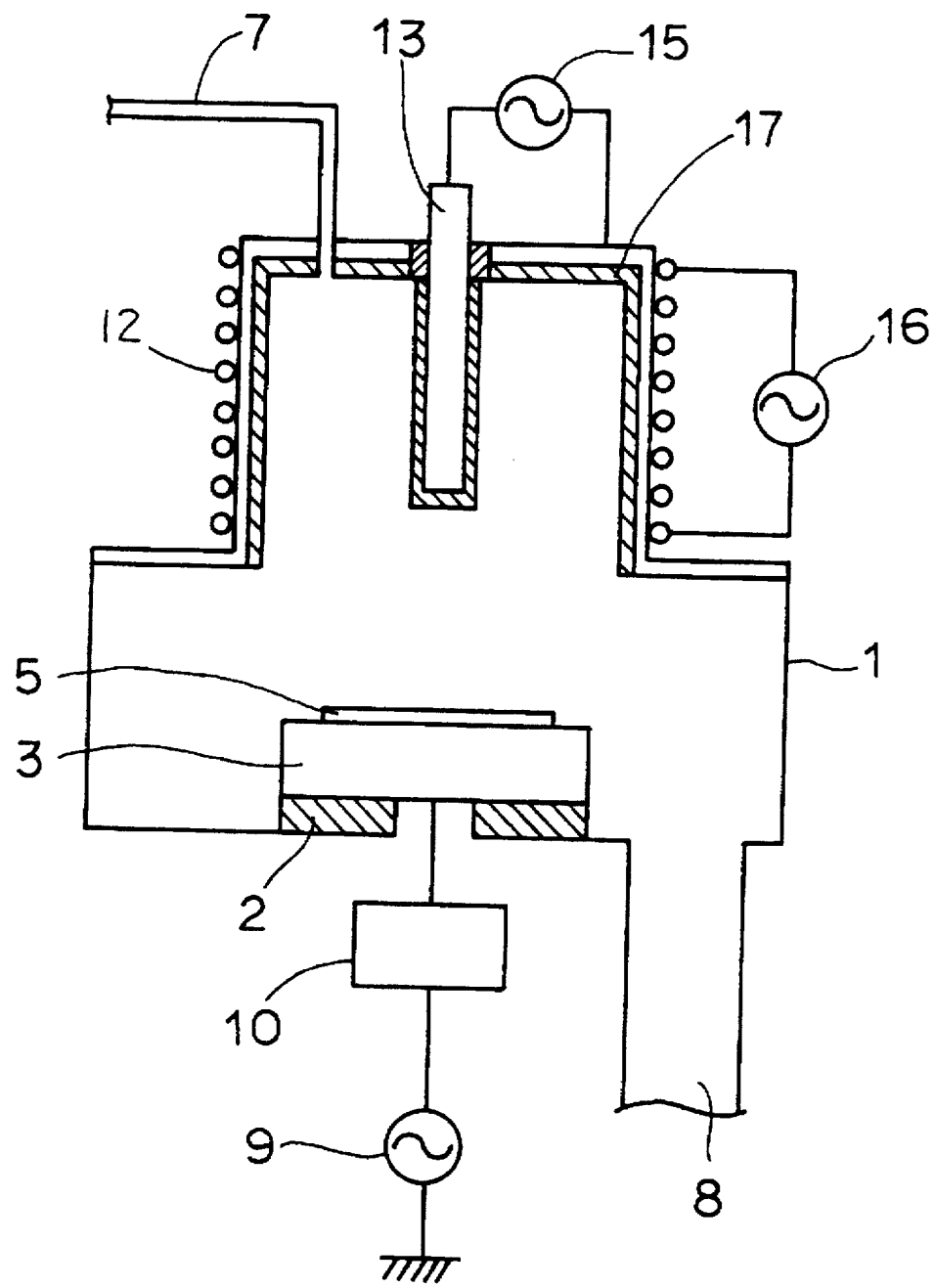
FIG. 4 is a sectional view of a plasma reaction apparatus according to a second embodiment of the present invention.

Second embodiment of the present invention will be described. FIG. 4 is a longitudinal sectional view of the plasma reaction apparatus according to the present embodiment.

The present embodiment is different from the plasma reaction apparatus of the above-described first embodiment shown in FIG. 1 in that an AC power supply 15 is connected between the reaction container and the bar-shaped electrode and an AC power supply 16 is connected to solenoid coil 12. In addition, a quartz cover 17 is provided inside reaction container 1 and on the sidewall of the bar-shaped electrode for preventing metal contamination from the electrodes. The present embodiment has the same structure as the plasma reaction apparatus of the first embodiment in other respects.

When the plasma reaction apparatus of the first embodiment is used over a long time period, reactive products consisting of insulating materials resulting from product formed when the substrate is etched or a polymer produced by recombination of decomposed gas are adhered to the inner wall portion of the first electrode, and consequently, the inner wall portion of the first electrode 1 and the sidewall of the second electrode 13 are covered with the insulating materials, thereby disabling application of the DC electric field. The plasma reaction apparatus according to the second embodiment is made to solve these problems.

Figure 5:
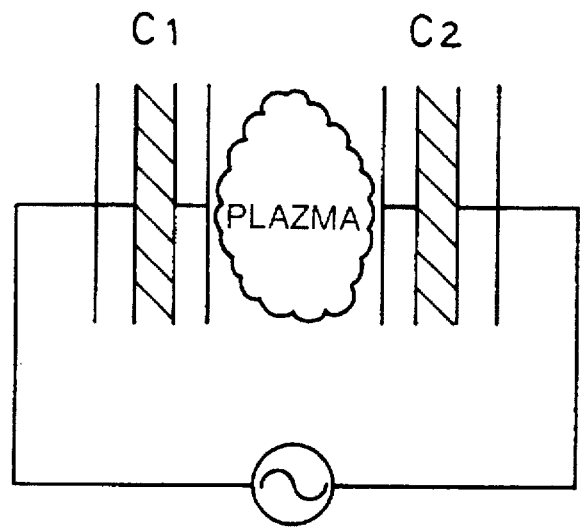
FIG. 5 is a schematic view showing a feature of the plasma reaction apparatus according to the second embodiment of the present invention.

In the second embodiment, AC electric field (E) and AC magnetic field (B) are generated as described above. Thus, as shown in FIG. 5, even if insulating materials are adhered to the inner wall portion of reaction container 1 and the sidewall of bar-shaped electrode 12, as these materials substantially form capacitors $C_1$ and $C2$ respectively and phase is inverted periodically, current is continuously supplied and the AC electric field and the AC magnetic field can be generated without interruption.

If frequencies of AC power supply 15 and AC power supply 16 are made equal with each other and phase difference between AC electric field E and AC magnetic field B is set to 0° or 180°, the E×B drift can be fixed in a certain direction. Consequently, high density plasma can be obtained, because energy of ions and electrons within plasma can be enhanced.

In the present embodiment, maldistribution of plasma does not occur as in the first embodiment, as shown in FIG. 3, so that plasma density is uniform at any time, whereby the potential of the wafer and the surface potential of the wafer become uniform.

Although 13.56 MHz power supply has been used for AC power supplies 15 and 16 in the present embodiment, any frequencies falling in the range of about 10 KHz to about 100 MHz where plasma can be generated under pressure range of 1 to 1000 mTorr suitable for etching may be utilized.

Figure 6:
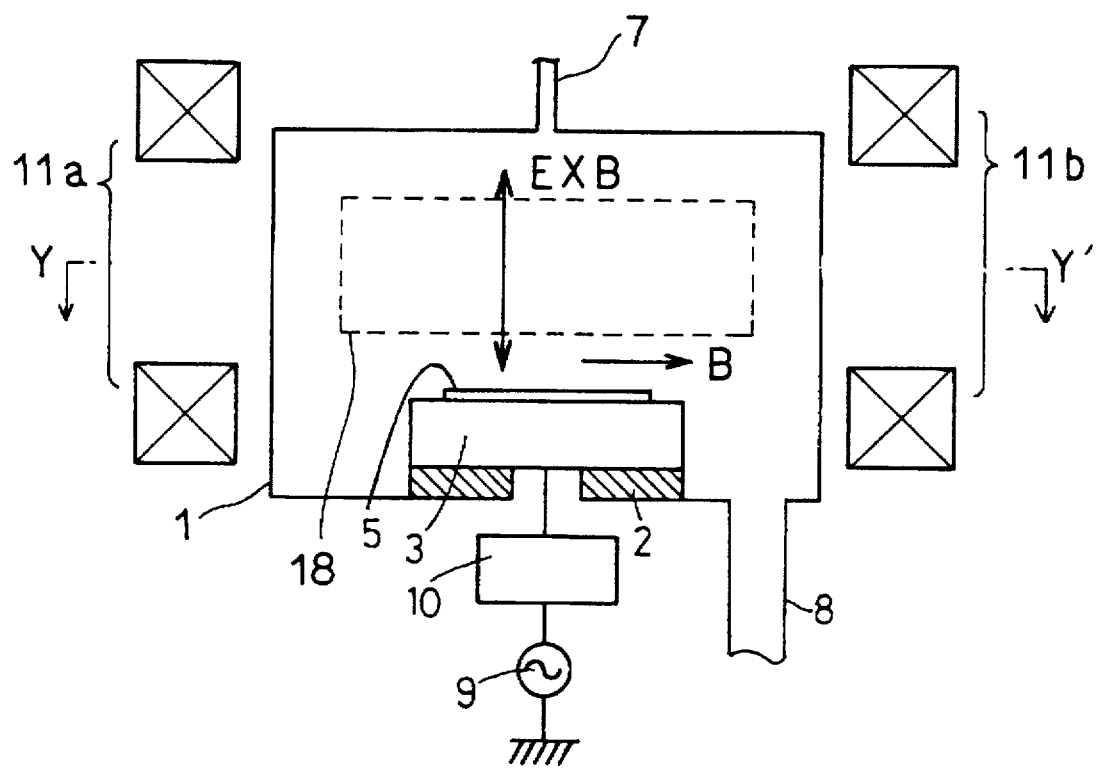
FIG. 6 is a sectional view of a plasma reaction apparatus according to a third embodiment of the present invention.

Third embodiment of the present invention will be described below. FIG. 6 is a sectional view of the plasma reaction apparatus of the embodiment.

Referring to the figure, the plasma reaction apparatus includes a pair Of electrodes 18, 18 disposed a predetermined distance apart from each other at opposite positions along outer surface of a cylindrical reaction container, each having a predetermined radius of curvature smaller than 180°, for generating an electric field within the reaction container. Mirror magnetic field generating coils 11a, 11b disposed outside reaction container 1, for generating a magnetic field in the direction perpendicular to the direction in which the pair of electrodes 18, 18 oppose with each other and perpendicular to the central axis of said reaction container, are provided.

Gas inlet 7 for introducing the reactive gas is provided at an upper portion of reaction container 1. Sample table 3 is provided on insulating material 2 at a lower portion of reaction container 1 and wafer 5 is placed on sample table 3. One end of a high frequency power supply 9 is connected to sample table 3 through impedance matching apparatus 10, while the other end of high frequency power supply 9 is connected to the ground. Exhaust 8 is provided at a lower portion of reaction container 1.

When a thin film is formed on wafer 5 or etching is conducted in the plasma reaction apparatus having the above structure, unnecessary gas within reaction container 1 is sufficiently exhausted from exhaust 8. Then, while introducing the reactive gas into the first electrode 1 through gas inlet 7, a portion thereof is exhausted from exhaust 8 for keeping the internal pressure of reaction container 1 at a predetermined value.

Then, the AC electric field (E) is generated between electrodes 18, 18 by connecting a high frequency power supply 16 to the pair of electrodes 18, 18. The AC power supply is connected to magnetic field generating coils 11a, 11b so that the AC magnetic field (B) is generated in the direction perpendicular to the direction in which the pair of electrodes 18, 18 oppose to each other.

Figure 7:
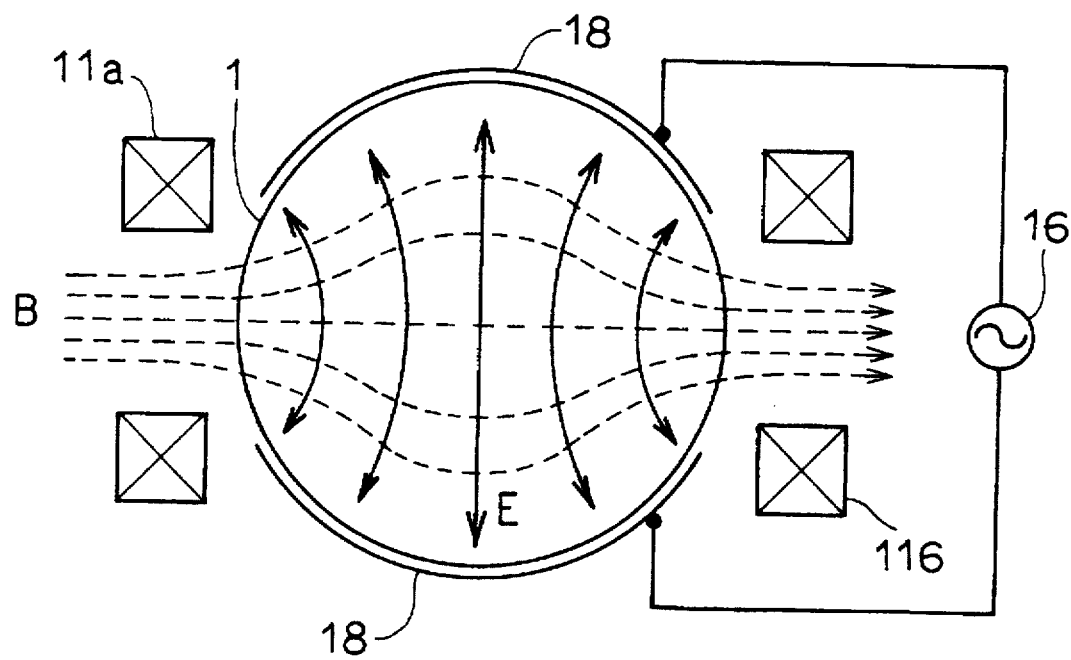
FIG. 7 is a cross sectional view taken along line Y-Y' in FIG. 6.

FIG. 7 is a cross sectional view taken along line Y-Y' in FIG. 6.

Referring to the figure, AC electric field E shown by E in the figure is generated between the pair of electrodes 18, 18, while AC magnetic field B perpendicular to AC electric field E is generated by mirror magnetic field generating coils 11a, 11b.

AC electric field E and mirror magnetic field B are generally orthogonal with each other within reaction container 1, whereby the reactive gas introduced into reaction container 1 through gas inlet 7 is turned to plasma by magnetron discharge.

In the present embodiment, plasma is not biased to a particular position on the surface of the wafer, but plasma is in uniform distribution because the E×B drift direction is perpendicular to the wafer 5 as shown by arrow E×B in FIG. 6.

Figure 8:
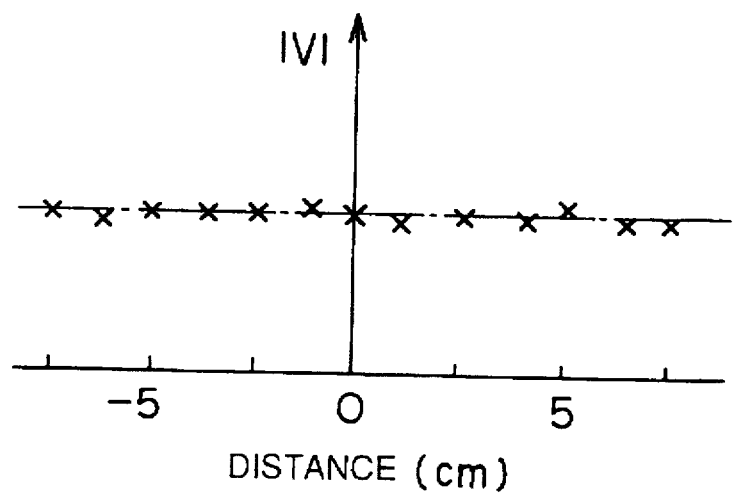
FIG. 8 shows potentials of a wafer and a wafer surface when the plasma reaction apparatus according to the third embodiment of the present invention is employed.
Figure 9:
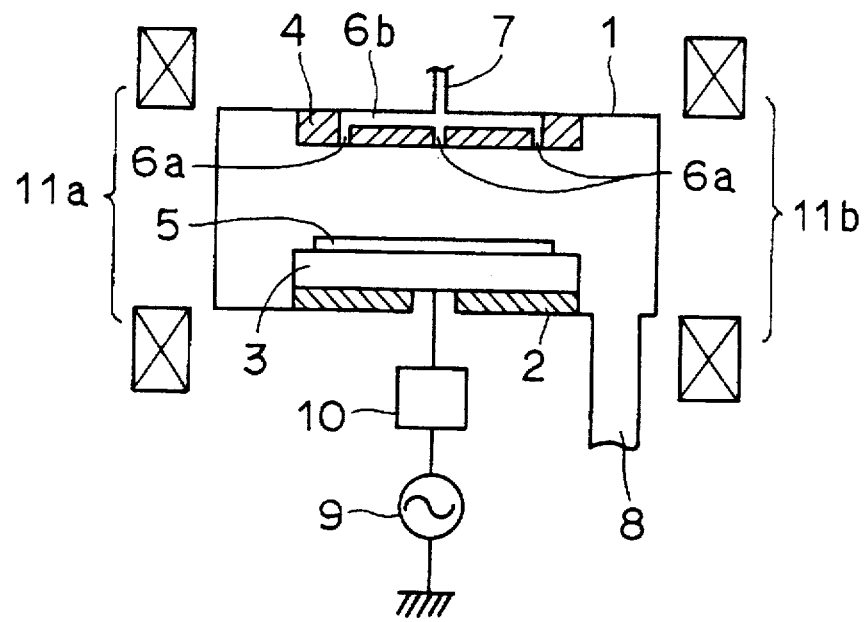
FIG. 9 is a sectional view of a conventional plasma reaction apparatus.
Figure 10:
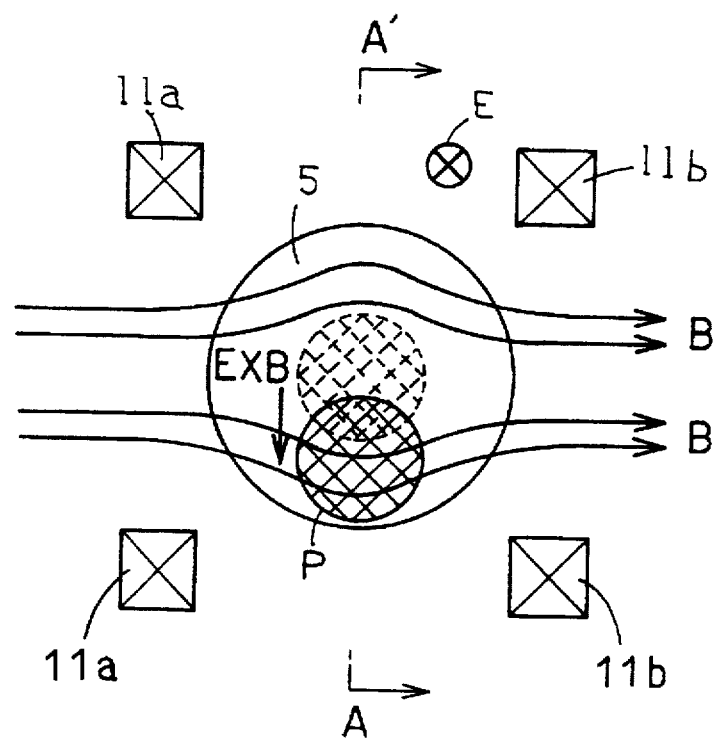
FIG. 10 is a plan view showing problems of the conventional plasma reaction apparatus.
Figure 11:
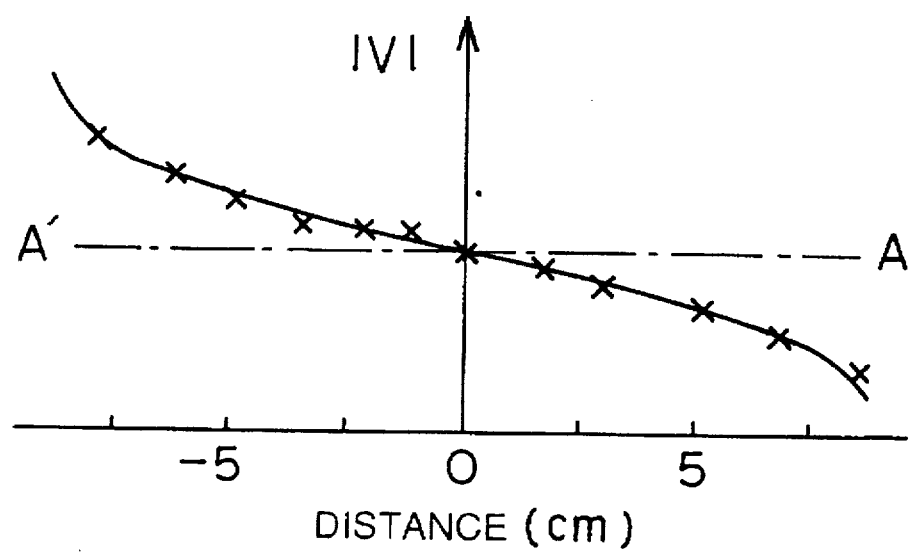
FIG. 11 shows potentials of a wafer and a wafer surface on a cross section taken along line A'-A in FIG. 10.

Referring to FIG. 8, the potential of the wafer is equal to the surface potential of the wafer because plasma density is uniform at any time, and therefore a difference does not occur between the potential of the wafer and the local potential of the surface of the wafer, whereby damage of the device formed on the wafer can be prevented.

As in the second embodiment, if frequencies of the AC power supplies are made identical and the phase difference between AC electric field (A) and AC magnetic field (B) is set to 0° or 180°, the highest possible density of plasma can be obtained because the E×B drift is always directed to the wafer surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma reaction apparatus, comprising:

electric field generating means including a cylindrical reaction container serving as a first electrode, and a bar-shaped electrode serving as a second electrode, said bar-shaped electrode being connected to a DC power supply and having its central axis positioned on a central axis of said reaction container for generating a DC electric field between the bar-shaped electrode and said reaction container;

magnetic field generating means disposed outside said reaction container for generating a magnetic field in said reaction container in the direction parallel to the central axis of said reaction container; and wafer placing means for placing a wafer perpendicular to said magnetic field.

2. A plasma reaction apparatus, comprising:

electric field generating means including a cylindrical reaction container serving as a first electrode, and a bar-shaped electrode serving as a second electrode and having its central axis positioned on a central axis of said reaction container for generating an electric field between the bar-shaped electrode and said reaction container;

magnetic field generating means disposed outside said reaction container for generating a magnetic field in said reaction container in the direction parallel to the central axis of said reaction container; and wafer placing means for placing a wafer perpendicular to said magnetic field, wherein
said electric field generating means generates an AC electric field by applying an AC voltage between said reaction container and said bar-shaped electrode,
said magnetic field generating means generates an AC magnetic field using an AC power supply, and
a phase difference between said AC electric field and said AC magnetic field is set to 0° or 180°.

3. A plasma reaction apparatus, comprising:

electric field generating means disposed a distance apart from each other at opposite positions along outer surface of a cylindrical reaction container, each having a radius of curvature smaller than 180°, for generating an electric field within the reaction container;

magnetic field generating means disposed outside said reaction container for generating a magnetic field in the direction perpendicular to the direction in which said pair of electrodes oppose with each other and perpendicular to the central axis of said reaction container; and wafer placing means for placing a wafer horizontal to said electric field and said magnetic field.

4. The plasma reaction apparatus according to claim 3, wherein
said electric field generating means generates the AC electric field by applying the AC voltage between said pair of electrodes,
said magnetic field generating means generates the AC magnetic field using the AC power supply, and
high concentration plasma is generated toward said wafer surface by setting the phase difference between said AC electric field and said AC magnetic field to 0° or 180°.

* * * * *